(12) United States Patent
Nishisaka

(10) Patent No.: US 8,853,020 B2
(45) Date of Patent: Oct. 7, 2014

(54) METHOD OF MANUFACTURING SEMICONDUCTOR DEVICE

(75) Inventor: Mika Nishisaka, Chuo-ku (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 458 days.

(21) Appl. No.: 13/115,648

(22) Filed: May 25, 2011

(65) Prior Publication Data

US 2011/0294270 A1 Dec. 1, 2011

(30) Foreign Application Priority Data

May 27, 2010 (JP) .................... 2010-121640

(51) Int. Cl.
| | | |
|---|---|---|
| H01L 21/336 | (2006.01) | |
| B82Y 40/00 | (2011.01) | |
| B82Y 10/00 | (2011.01) | |
| H01L 29/66 | (2006.01) | |
| H01L 21/265 | (2006.01) | |
| H01L 29/78 | (2006.01) | |

(52) U.S. Cl.
CPC .......... *H01L 29/66492* (2013.01); *B82Y 10/00* (2013.01); *H01L 29/66575* (2013.01); *H01L 21/26586* (2013.01); *H01L 29/6656* (2013.01); *H01L 29/7833* (2013.01); *Y10S 977/89* (2013.01)
USPC ................. 438/197; 977/890; 257/E21.409

(58) Field of Classification Search
None
See application file for complete search history.

(56) References Cited

U.S. PATENT DOCUMENTS 5,872,382 A * 2/1999 Schwalke et al. ............. 257/408

FOREIGN PATENT DOCUMENTS

JP 2006-128540 A 5/2006

\* cited by examiner

*Primary Examiner* — Seahvosh Nikmanesh
(74) *Attorney, Agent, or Firm* — Sughrue Mion, PLLC

(57) ABSTRACT

Extension regions 7 are formed through implantation using offset sidewalls 6a of a footing profile as a mask, and sidewalls 9 are formed on the offset sidewalls 6a so that source and drain regions 10 are formed into the sidewall through implantation, so that the extension regions 7 are made separated away from both edges of the gate, contributing to enlargement in an effective gate length, and dealing with the narrowed gate pitch, without increasing the number of processes.

9 Claims, 4 Drawing Sheets

METHOD OF MANUFACTURING SEMICONDUCTOR DEVICE

BACKGROUND OF THE INVENTION

1. Field of the Invention

The present invention relates, in general, to a method of manufacturing a semiconductor device and, more particularly, to a method of manufacturing a metal-oxide-semiconductor (MOS) transistor.

2. Description of the Related Art

In a semiconductor device such as large scale integration (LSI) or the like, a transistor, particularly a MOS transistor, is widely used as a switching device. Generally, the MOS transistor has a structure that includes a gate electrode on a semiconductor substrate with a gate insulating film interposed therebetween, and source and drain regions which are formed on the semiconductor substrate.

It is known that if the gate length L of the transistor becomes short with the miniaturization of the semiconductor device, the transistor in which short channel effects are not sufficiently restricted is difficult to be turned off, so that threshold voltage Vt becomes lowered. Such dependency of threshold voltage on the gate length is called a Vt-L roll-off characteristic. If the dependency of threshold voltage on the gate length is large approximately at a target gate length, characteristics of a transistor becomes greatly non-uniform because of non-uniformity in fabrication of a gate with the length. Thus, a transistor is needed to be designed such that the dependency of threshold voltage on the gate length becomes reduced.

In order to restrict the short channel effects, it can be taken a measure such as a gate insulating film being made thinner, concentration of impurities in a substrate being made higher, source and drain junctions being made shallow, an adaptation of lightly doped drain (LDD) structure, and the like. Particularly, the LDD structure is suitable to realize a short-channel transistor because it enables not only source and drain junctions contacting a channel to be made shallow without sacrificing electric resistance not much, but also generation of hot electrons to be restricted by raising surface breakdown voltage of drain.

In the LDD structure, offset sidewall spacers formed from a thin insulating film are formed on sidewalls of a gate electrode, and impurities are shallowly and lightly implanted into a semiconductor substrate with the offset sidewall spacers as a mask to form low concentration impurity regions (extension regions). Next, sidewall spacers formed from a thick insulating film are formed on the sides of the offset sidewall spacers, and impurities are deeply and highly implanted into the semiconductor substrate with the sidewall spacers as a mask to form source and drain regions. With the advance of generation, the gate length will be made much shorter, so that only the LDD structure cannot sufficiently restrict the short channel effects. To solve this problem, measures are currently taken, such as forming a halo region in which channel impurities are doped with higher concentration than the ordinal concentration, forming pocket regions in which impurities with the same conductive type as the channel impurities are doped in both sides of a channel in the extension regions, or the like.

A method of forming the conventional LDD structure having the pocket regions will now be described with reference to figures.

FIGS. 8 to 10 are cross-sectional views showing a method of manufacturing a MOS transistor having the conventional LDD structure.

A gate insulating film 2, a gate conductive film 3, and a cap insulating film 4 are formed into the shape of a gate electrode 5 on a p-type semiconductor substrate 1 on which element isolations and wells (not shown) are formed. The gate conductive film 3 may be formed from a polysilicon film, a metal film, or the combination thereof.

Subsequently, a first insulating film, e.g. a silicon oxide film, is formed on the semiconductor substrate 1, and is etched back to form offset sidewall spacers 6b on the sides of the gate electrode 5. Next, n-type impurities are ion-implanted into the semiconductor substrate 1 using the offset sidewall spacers 6b as a mask, thereby forming extension regions 7 (see FIG. 8). Subsequently, p-type impurities are ion-implanted into the semiconductor substrate through slant implantation or the like, thereby forming pocket regions 8 (see FIG. 9).

Next, a second insulating film, e.g. a silicon oxide film, is formed and etched back to form sidewall spacers 9 on the sides of the offset sidewall spacers 6b. Next, n-type impurities are highly doped into the semiconductor substrate 1 using the sidewall spacers 9 as a mask, thereby forming source and drain regions 10 (see FIG. 10).

Here, while the doped impurities are activated by annealing, in this case, the impurities for the extension region are diffused underneath the gate electrode, causing a problem such as an effective gate length $L_{eff}$ being shorten. To inhibit this problem, methods can be taken such as (1) thickening the offset sidewall spacers 6b so as to force the extension regions away from the edges of the gate, (2) raising the concentration of the pocket regions, (3) shallowing the extension regions, and the like.

In case of the method (1), it is effective if the gate pitch is sufficiently large, but with recent tendency to miniaturization of a device, it becomes invalid because the gate pitch becomes narrow, and the thickening may also be impossible because of the restrictions of layout.

In case of the method (2), simply making highly concentrated pocket regions may cause a reverse short channel characteristic, and increases the electric field strength at the end of the drain, causing remarkably hot carrier degradation.

In case of the method (3), if the extension regions are made shallow, parasitic resistance increases, and thus on current of the transistor problematically decreases.

The problem of the method (1) may be solved by the following manner. A thick offset sidewall spacers are formed to separate the extension regions away from the end of the gate, and then the offset sidewall spacers are removed and sidewall spacers to be doped with impurities for source and drain are formed, thereby dealing with the narrowed gate pitch. For example, in order to deal with the narrowed gate pitch, JP A 2006-128540 proposed a method in which lower sidewall spacers are wet-etched to leave a portion thereof on both lower ends of a gate electrode, and then upper sidewall spacers are formed thereon, thereby preventing the thickness of the sidewall spacers from being made excessively thicker.

However, the method of the JP A 2006-128540 has a problem in that the sidewall spacer removal process has to be added. Further, when pocket regions are formed, an ion implantation is carried out after removal of the offset sidewall spacers since effective pocket regions are not formed underneath a gate through the ion implantation into the thickened offset sidewall spacers. Here, in case of using a metal material to form a gate electrode, if the offset sidewall spacers are removed, upon slant implantation for forming the pocket regions, impurity ions also collide with the gate electrode, probably causing metallic contamination due to scattering of the metal material.

SUMMARY

In an embodiment of the present invention, a method of manufacturing a semiconductor device includes:

forming a gate electrode on a semiconductor substrate of a first conductive type;

forming a first insulating film on the semiconductor substrate including the gate electrode;

etching the first insulating film to form first sidewall spacers on a sides of the gate electrode;

doping second conductive type impurities with a low concentration on the surface of the semiconductor substrate using the first sidewall spacers as a mask;

forming a second insulating film on the semiconductor substrate including the first sidewall spacers;

etching the second insulating film to form second sidewall spacers on the first sidewall spacers; and doping second conductive type impurities with a high concentration on the surface of the semiconductor substrate using the second sidewall spacers as a mask, wherein each of the first sidewall spacers has a footing portion with a width at the bottom position wider than a width at the position substantially parallel with the side surface of the gate electrode.

In another embodiment of the present invention, a method of manufacturing a semiconductor device includes:

forming a gate electrode on a semiconductor substrate of a first conductive type;

forming a first insulating film on the semiconductor substrate including the gate electrode;

etching the first insulating film to form first sidewall spacers on both sides of the gate electrode such that each of the first sidewall spacers has a footing portion with a width at the bottom position wider than a width at the position substantially parallel with the side surface of the gate electrode; and doping second conductive type impurities on the surface of the semiconductor substrate using the footing portion of the first sidewall spacers as a mask, thereby forming first impurity-diffusion regions.

According to an embodiment of the present invention, implantation position of impurities for an extension region is separated away from the edge of the gate electrode, thereby restricting the short channel effect and dealing with narrowed gate pitch.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
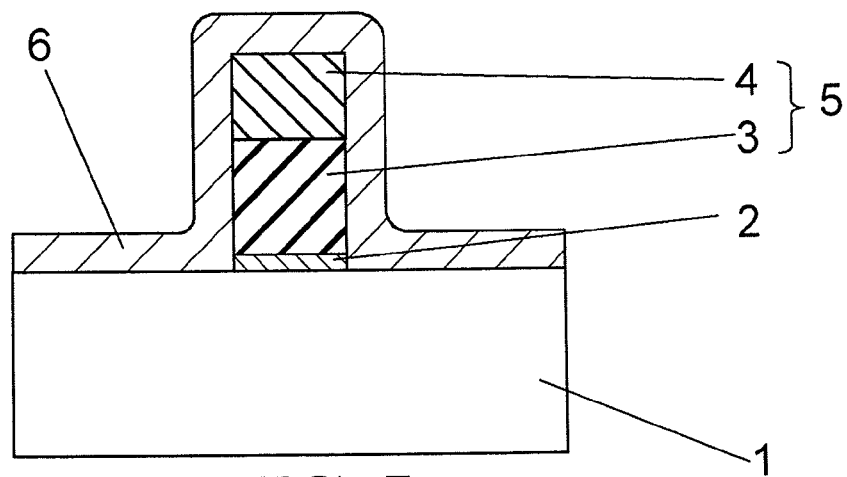
FIGS. 1 to 4 are cross-sectional views explaining a procedure of a method of manufacturing a semiconductor device according to an embodiment of the present invention.
Figure 2:
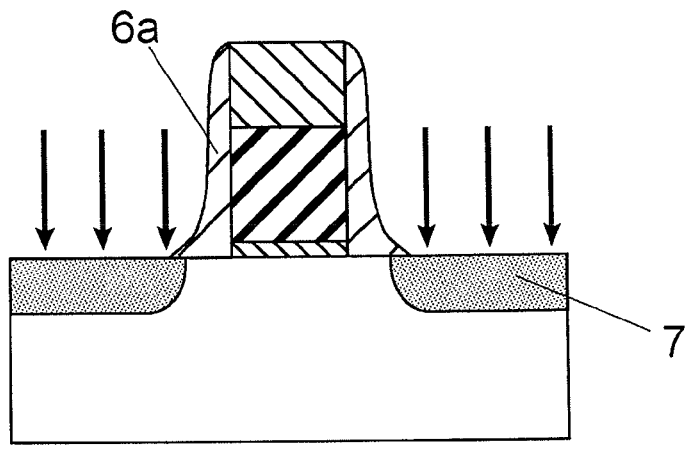

The invention will be now described herein with reference to illustrative embodiments. Those skilled in the art will recognize that many alternative embodiments can be accomplished using the teachings of the present invention and that the invention is not limited to the embodiments illustrated for explanatory purpose.

According to the present invention, offset sidewall spacers (first sidewall spacers) for formation of extension regions have a footing profile and the extension regions are separated away from the edge of a gate electrode, so that though sidewall spacers for formation of source and drain regions are formed on that offset sidewall spacers, the thickness of the sidewall spacer becomes the thickness to correspond to an additional part of a thickness to the thickness of an upper portion of the offset sidewall spacer, thereby dealing with narrowed gate pitch.

Hereinafter, illustrative embodiments will be described, but the invention is not limited thereto.

FIGS. 1 to 4 are cross-sectional views explaining a procedure of a method of manufacturing a semiconductor device according to an embodiment of the present invention.

First, a gate insulating film 2, a gate conductive film 3, and a cap insulating film 4 are formed into the shape of a gate electrode 5 on a first conductive type (here, p-type) semiconductor substrate 1 on which element isolations and wells (not shown) are formed. The gate conductive film 3 may be formed from a polysilicon film, a metal film, or the combination thereof. For example, a poly-metal structure in which tungsten (W) or tungsten nitride (WN) is formed on polysilicon, a polycide structure in which tungsten silicide (WSi) and tungsten (W) are stacked on polysilicon, or the like can be used. In case of using metal material only, a metal electrode may be formed on a gate insulating film having a high dielectric constant (high k-film). The cap insulating film 4 serves as a hard mask when forming an electrode, and is formed from a silicon nitride film or the like.

Subsequently, a first insulating film 6, e.g. a silicon oxide film, is formed on the semiconductor substrate 1 including the gate electrode 5. The state of the film after being formed is shown in FIG. 1. Next, the first insulating film 6 is etched back to form offset sidewall spacers 6a on both sides of the gate electrode. When the first insulating film 6 is etched back, the etching state can be accurately monitored by monitoring the wavelength of plasma. Upon etch-back, if the etching is terminated at the same time when the exposure of the surface of the substrate is detected, each of the offset sidewall spacers has a profile of footing shown in FIG. 2. Further, considering an etching rate of the first insulating film, an over-etching may be performed for a certain time after the detection of the exposure of the substrate surface, thereby reducing the width of a lower portion of each of the offset sidewall spacers.

Figure 6:
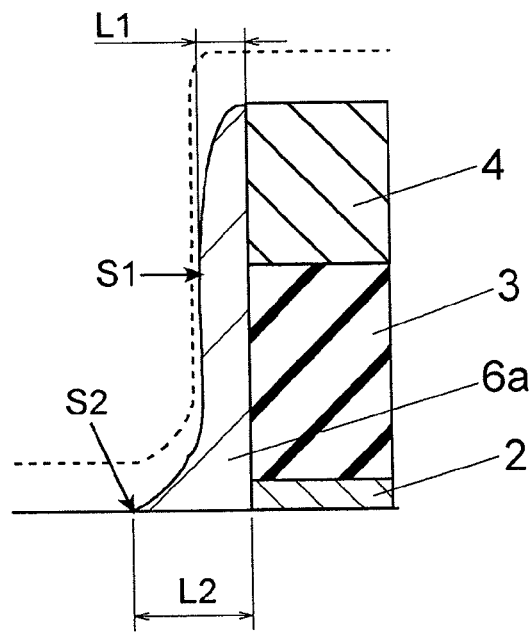
FIG. 6 is a partially enlarged cross-sectional view explaining a profile of an offset sidewall spacer according to an embodiment of the present invention.
Figure 8:
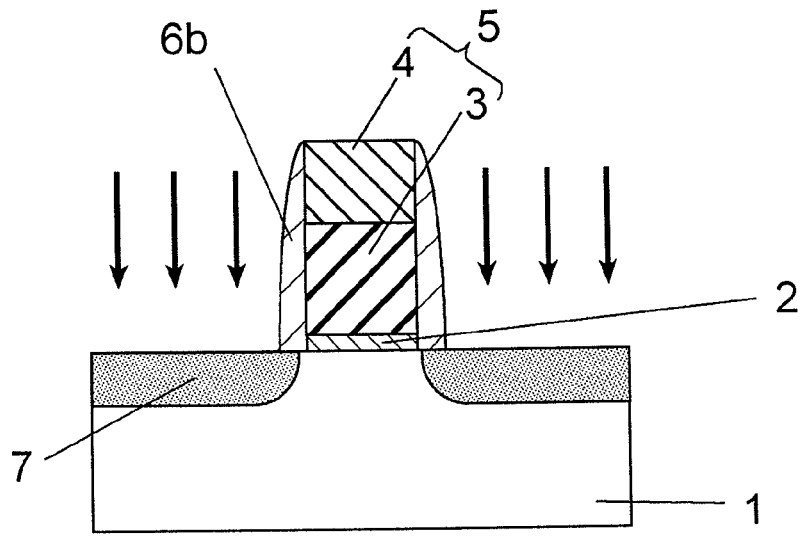
FIGS. 8 to 10 are cross-sectional views explaining a procedure of a method of manufacturing a semiconductor device according to the related art.

FIG. 6 is a partially enlarged cross-sectional view of the offset sidewall spacer 6a according to an embodiment of the present invention, wherein the dashed line shows the position where the first insulating film 6 is formed. While the first insulating film 6 is conformally formed on the semiconductor substrate 1 by a film-forming method with excellent coverage, an angled part of a lower portion of the sidewall of the gate electrode 5 is made slightly round. When this is etched back using an anisotropic etching method, at the stage of the substrate surface being exposed, the profile of footing is shown along with the reflection of the round portion. The offset sidewall spacer 6b having the vertical profile shown in FIG. 8 is generally being continuously etched back even after the substrate surface being exposed, so that such a footing state does not remain. This is because the termination time of etching is empirically determined based on the estimated time when the insulating film on the substrate is sufficiently removed, without detecting the exposure of the substrate surface as in the present invention.

Figure 4:
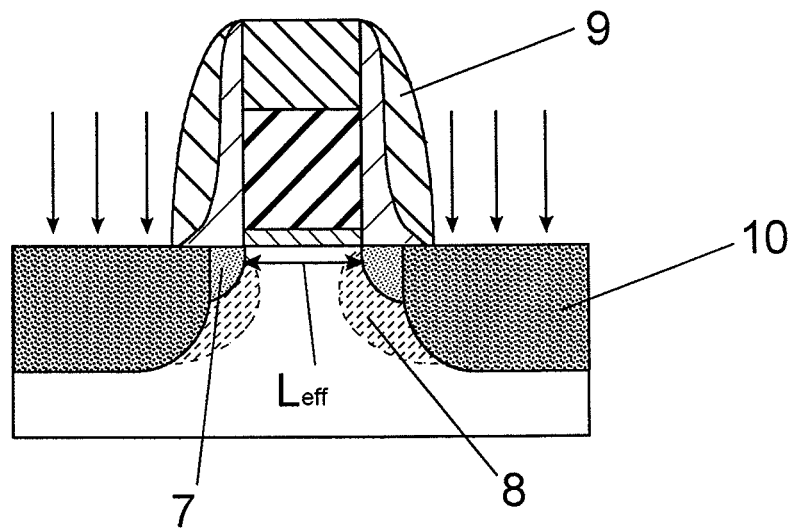

Since the offset sidewall spacer 6a according to the present invention is formed by etching back the first insulating film having the side face that is substantially parallel with the side of the gate electrode, a portion of the side surface of the offset sidewall spacer 6a has a profile having a side surface that is substantially parallel in part with the side of the gate electrode, through reflection of the former profile. Meanwhile, while this case shows slight side etching, it is possible to perform etching back without the side etching according to a condition. The term 'substantially parallel' means the parallel state including a slight step, a gently inclination, or the like occurring upon film forming or side etching. In the case shown in FIG. 6, on the substrate surface, a width L2 between the lower edge of the gate electrode and the lower end S2 of the footing profile substantially twice of a width L1 of the offset sidewall spacer 6a at a position S1 where the side surface of the offset sidewall spacers 6a is substantially parallel with the side of the gate electrode. Further, as described above, the width L2 can be regulated by over-etching for a certain time. By performing an ion-implantation using the offset sidewall spacer 6a of the footing profile as a mask, the extension region can be separated away from the edge of the gate. While the thickness of the first insulating film for forming the offset sidewall spacer 6a may vary according to the size of a transistor, generally 1-20 nm, preferably 5-15 nm, according to the present invention, it is preferred that the width L2 be 1.5 or more times the width L1. Like this, according to the present invention, the extension region is made separated away from the edge of the gate electrode, so that compared to the case of using the vertical profile type offset sidewall spacer 6b of the related art, the effective gate length ($L_{eff}$) can be enlarged as shown in FIG. 4.

Next, second conductive type (here n-type) impurity ions for forming the extension regions 7 (first impurity diffusion region) are implanted using the offset sidewall spacers 6a as a mask. Here, the magnitude of implantation energy is controlled such that impurity ions cannot be implanted into the footing portion of the offset sidewall spacers 6a.

For example, the implantation can be performed under the following condition.

Ion element: As or P,
Dose: $1E14$-$2E15$ cm$^{-2}$,
Implantation energy: 0.5-10 KeV.

Figure 3:
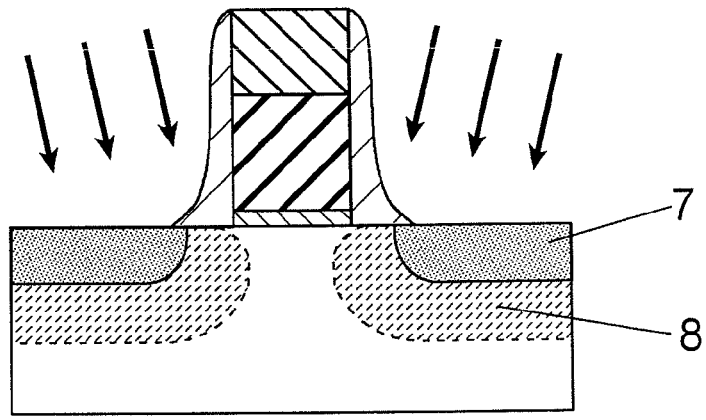

Next, as shown in FIG. 3, first conductive type (here p-type) impurity ions for forming pocket regions 8 (third impurity diffusion regions) are implanted.

For example, the implantation can be performed under the following condition.

Ion element: B, $BF_2$ or In,
Dose: $1E12$-$5E13$ cm$^{-2}$,
Implantation Energy:
B: 5-15 KeV
$BF_2$: 20-50 KeV
In: 40-150 KeV
Implantation angle: 0-45 degrees.

Figure 9:
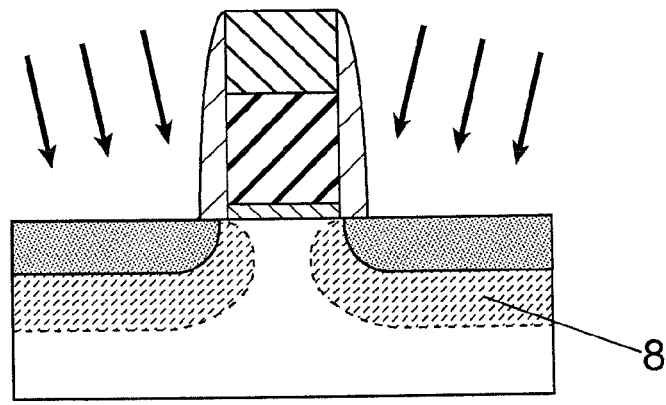
Figure 10:
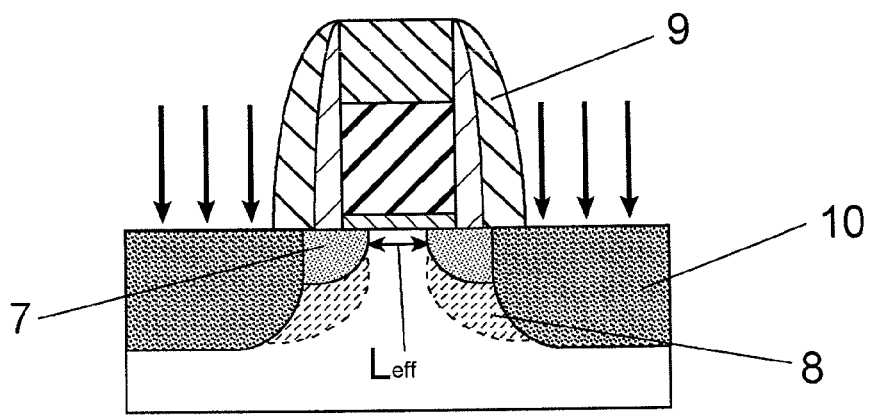

When forming the pocket regions 8, generally, the implantation energy becomes higher than when forming the extension region 7. As a result, the impurity ions are implanted into the semiconductor substrate 1 through the footing lower portions of the offset sidewall spacers 6a, so that the pocket regions 8 are formed at substantially the same position as that using the offset sidewall spacers 6b of the conventional structure (see FIG. 9). Here, since the side faces of the gate electrode are covered with the offset sidewall spacers 6a, even though impurity ions for forming the pocket regions are implanted through slant implantation, the ions do not directly collide with the surface of the gate electrode. Thus, even when using a metal material as a material of a gate electrode, a problem of metallic contamination does not occur.

Figure 5:
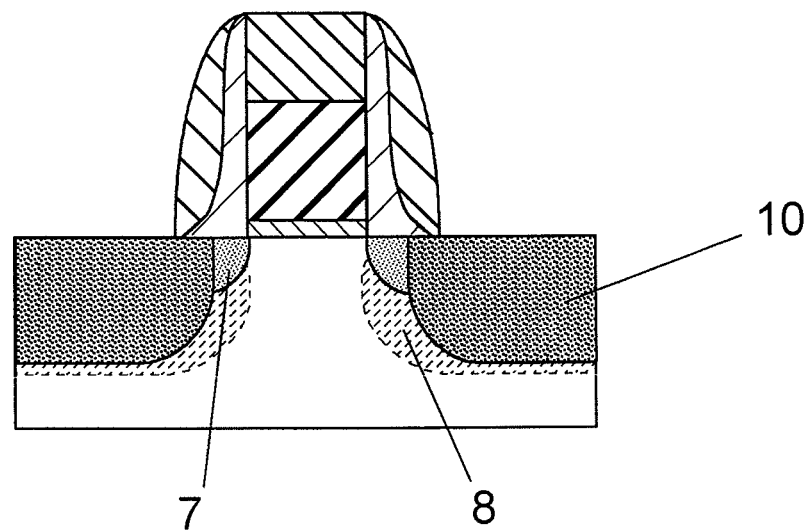
FIG. 5 is a cross-sectional view showing a modified embodiment of the structure of FIG. 4.

Next, as shown in FIG. 4, a second insulating film, e.g. a silicon oxide film, is formed in the thickness of 10 to 70 nm in order to form sidewall spacers 9 for forming source and drain regions, and then etched back. The second insulating film can be formed by a conventional CVD process, or the like, but there is no need to form it in a conformal fashion. The sidewall spacers 9 are not required to be formed like the footing profile as the offset sidewall spacers 6a, but are formed to have a vertical profile. The second conductive type (here n-type) ions are implanted using the sidewall spacers 9 as a mask, thereby forming the source and drain regions 10 (second impurity diffusion regions). Impurity ions for forming the source and drain are deeply implanted with a higher concentration than when forming the extension regions 7. Here, while in FIG. 4, the source and drain regions 10 are formed deeper than the pocket regions 8, as shown in FIG. 5, the source and drain regions 10 may be formed shallower than the pocket regions 8.

For example, the implantation can be performed under the following condition.

Ion element: As or P,
Dose: $1E15$-$5E15$ cm$^{-2}$,
Implantation energy: 4-30 KeV.

Finally, annealing is performed to activate the implanted impurity ions. Meanwhile, annealing can be performed after implantation for forming the pocket regions.

In the present invention, by performing the ion implantation for formation of the extension regions 7 using the offset sidewall spacers 6a with the footing profile as a mask, the extension regions 7 can be made separated away from the edge of the gate. As a result, the effect gate length $L_{eff}$ becomes longer than when using the conventional offset sidewall spacers 6b with the vertical profile, thereby restricting the short channel effect. Further, the sidewall spacers for forming the source and drain regions can be formed by etching back it until its profile becomes a substantially vertical profile on the semiconductor substrate, the sidewall spacers have the thickness to correspond to only an increment from the upper width (the width L1) of the offset sidewall spacers 6a, thereby dealing with the narrowed gate pitch. Further, the pocket regions can be formed by performing an ion implantation through the offset sidewall spacers with the footing profile, so that a process of removing the offset sidewall spacers is not required. Moreover, since the gate electrode is covered at its side faces with the offset sidewall spacers, even though the gate electrode is formed of metal material, the metallic contamination can be prevented.

Figure 7:
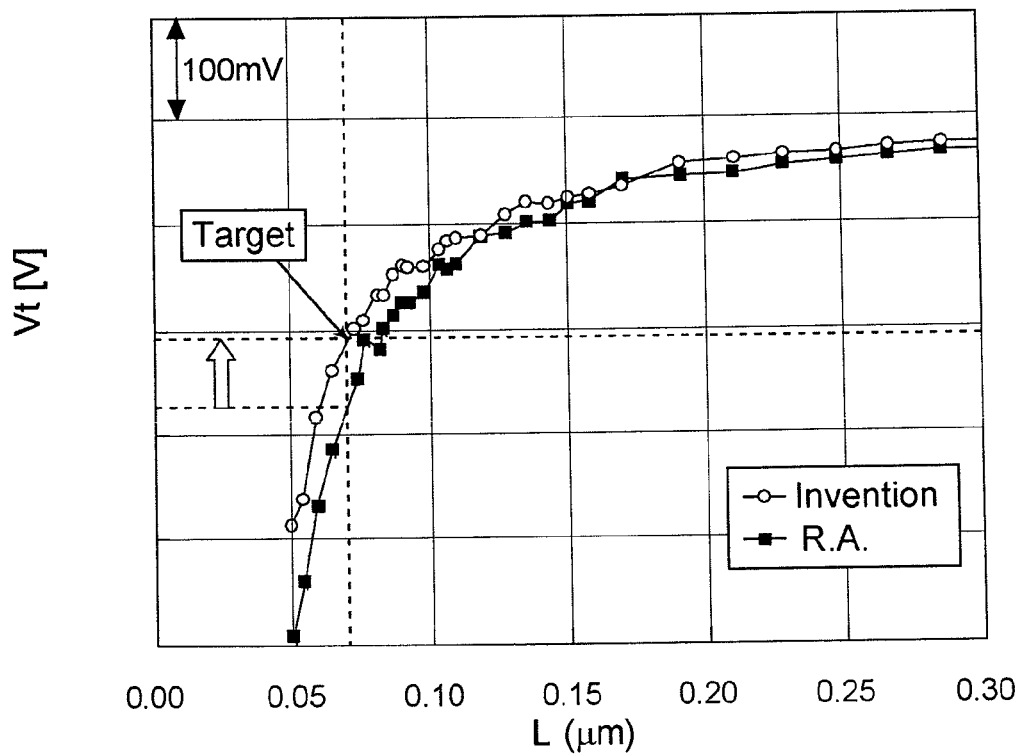
FIG. 7 is a graphical diagram showing a Vt-L roll-off curve explaining the effects of the present invention.

In order to verify the effects of the present invention, two Vt-L roll-off curves concerned on the case of using the offset sidewall spacers 6a of the footing profile according to the present invention and the case of using the offset sidewall spacers 6b of the vertical profile according to the related art (in both cases, the thickness of the first insulating film is 10 nm) are shown in FIG. 7. Explaining the case of the target gate length of 70 nm, when applying the present invention to the conventional example, threshold voltage is improved by about 60 mV, so that it is understood that the dependency of the threshold voltage on the gate length becomes lower, thereby forming a transistor with less non-uniformity. As the gate length L is shorter, Vt tends to decrease due to the short channel effect. Here, in case where the tendency to decrease is sharp, if non-uniformity occurs in variation of the length L during manufacturing a transistor, Vt also becomes sharply non-uniform, adversely influencing the circuit operation. Thus, it is important to restrict the short channel effect. According to the present invention, with restriction of the short channel effect, non-uniformity in Vt of a transistor can be restricted.

The present invention is particularly effective when the gate length is not more than 150 nm as shown in FIG. 3. Thus, in case of forming transistors having different gate lengths at the same time, it may be configured such that the offset sidewall spacers of the footing profile are adapted to the transistor having the short gate length, and the offset sidewall spacers of the conventional vertical profile are adapted to the transistor having the long gate length. However, since such division also increases the number of processes, the offset sidewall spacers of the footing profile are preferably adapted to all of the transistors formed at the same time, excluding the case where such footing profile of the offset sidewall spacers causes certain defects.

While the embodiment illustrated the transistor in which the first conductive type is p-type, it may employ the transistor in which the first conductive type is n-type. Of course, the present invention can be adapted to a CMOS transistor.

What is claimed is:

1. A method of manufacturing a semiconductor device comprising:
    forming a gate electrode on a semiconductor substrate of a first conductive type;
    forming a first insulating film on the semiconductor substrate including the gate electrode;
    etching the first insulating film to form first sidewall spacers on both sides of the gate electrode;
    doping second conductive type impurities with a low concentration on the surface of the semiconductor substrate using the first sidewall spacers as a mask;
    forming a second insulating film on the semiconductor substrate including the first sidewall spacers;
    etching the second insulating film to form second sidewall spacers on the first sidewall spacers; and
    doping second conductive type impurities with a high concentration on the surface of the semiconductor substrate using the second sidewall spacers as a mask,
    wherein each of the first sidewall spacers has a footing portion including a slope, an angle between a tangent line at a point of the slope and the surface of the semiconductor substrate becomes gradually small when the point becomes closer to the surface of the semiconductor substrate, and
    wherein the first sidewall spacers are formed by terminating the etching of the first insulating film at the same time when detecting the exposure of the surface of the semiconductor substrate by monitoring a wavelength of plasma when etching the first insulating film, or after over-etching for a certain time.

2. The method of claim 1, further comprising doping first conductive type impurities on the surface of the semiconductor substrate using the first sidewall spacers as a mask, after doping the second conductive type impurities with the low concentration on the surface of the semiconductor substrate using the first sidewall spacers as a mask.

3. The method of claim 1, wherein the gate electrode comprises a metal material.

4. The method of claim 1, wherein the gate electrode has the gate length of not more than 150 nm.

5. A method of manufacturing a semiconductor device comprising:
    forming a gate electrode on a semiconductor substrate of a first conductive type;
    forming a first insulating film on the semiconductor substrate including the gate electrode;
    etching the first insulating film to form first sidewall spacers on both sides of the gate electrode such that each of the first sidewall spacers has a footing portion including a slope, wherein an angle between a tangent line at a point of the slope and the surface of the semiconductor substrate becomes gradually small when the point becomes closer to the surface of the semiconductor substrate; and
    doping second conductive type impurities on the surface of the semiconductor substrate using the first sidewall spacers as a mask,
    wherein the footing portion forms by stopping the etching of the first sidewall spacers at the same time as an exposure of the surface of the semiconductor substrate, and
    wherein the exposure of the surface of the semiconductor substrate detects by monitoring a wavelength of plasma during the etching.

6. The method of claim 5, further comprising:
    forming a second insulating film on the semiconductor substrate including the first sidewall spacers;
    etching the second insulating film to form second sidewall spacers on the first sidewall spacers; and
    doping second conductive type impurities on a surface of the semiconductor substrate using the second sidewall spacers as a mask.

7. The method of claim 6, wherein the doping using the second sidewall spacers as a mask forms second impurity diffusion regions.

8. The method of claim 7, wherein the second impurity diffusion regions have higher impurity concentration than the first impurity diffusion regions.

9. The method of claim 5, wherein the gate electrode comprises a metal material.

\* \* \* \* \*